US010411321B2

(12) United States Patent
Mueller

(10) Patent No.: US 10,411,321 B2
(45) Date of Patent: Sep. 10, 2019

(54) CIRCULATOR FOR USE IN SUPERCONDUCTING QUANTUM TECHNOLOGY

(71) Applicant: International Business Machines Corporation, Armonk, NY (US)

(72) Inventor: Peter Mueller, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 18 days.

(21) Appl. No.: 15/897,690

(22) Filed: Feb. 15, 2018

(65) Prior Publication Data

US 2019/0252754 A1    Aug. 15, 2019

(51) Int. Cl.
| H01P 7/08 | (2006.01) |
| H01P 1/38 | (2006.01) |
| H03H 7/18 | (2006.01) |
| G06N 10/00 | (2019.01) |

(52) U.S. Cl.
CPC .............. *H01P 1/38* (2013.01); *G06N 10/00* (2019.01); *H03H 7/18* (2013.01); *H01P 7/086* (2013.01)

(58) Field of Classification Search
CPC .... H03H 7/18; H03H 7/12; H01P 1/38; H01P 1/387; H01P 1/20381; H01P 1/2135; H01P 7/086; H01P 7/088
USPC ......................................... 333/1.1, 24.2, 99 S
See application file for complete search history.

(56) References Cited

U.S. PATENT DOCUMENTS

| 5,608,361 A * | 3/1997 | Weiss ...................... H01P 1/387 |
| | | 333/1.1 |
| 9,405,136 B2 | 8/2016 | Alu et al. |
| 9,509,274 B2 | 11/2016 | Naaman et al. |

FOREIGN PATENT DOCUMENTS

WO    WO2016094045 A1    6/2016

OTHER PUBLICATIONS

Pozar, "Microwave Engineering", Book (4th edition), John Wiley, 2012.
Lee et al., "Magnetic Parameters for Ultra-high Frequency (UHF) Ferrite Circulator Design", Journal of Magnetics, vol. 19, No. 4, Received Oct. 13, 2014, Received in final form Nov. 10, 2014, Accepted Nov. 10, 2014, pp. 399-403.

(Continued)

*Primary Examiner* — Stephen E. Jones
(74) *Attorney, Agent, or Firm* — Scully, Scott, Murphy & Presser, P.C.; Daniel Morris, Esp.

(57) ABSTRACT

A superconducting circulator device may be provided. The superconducting circulator device comprises more than two resonators of equal static resonance frequency chained to a ring system by strong coupling. Each of the resonators comprises an adjustable inductor built into the each one of the resonators. The device comprises also a set of ports, each one of the ports coupled to a corresponding one of the more than two resonators, a set of modulators, each one of the modulators positioned adjacently to a corresponding one of the adjustable inductor, and a set of modulation control ports. Each of the modulation control ports is connected to a corresponding modulator of the set of modulators such that each of the modulation control ports controls the related static resonance frequency of the related resonators and such that the ring system is modulatable.

18 Claims, 3 Drawing Sheets

(56) References Cited

OTHER PUBLICATIONS

Estep et al., "Magnetic-free non-reciprocity and isolation based parametrically modulated coupled-resonator loops", Nature Physics, vol. 10, Nov. 2014, pp. 923-927.
Kamal et al., "Noiseless non-reciprocity in a parametric active device", Nature Physics, vol. 7, Jan. 2011, pp. 311-315.
Kerckhoff et al., "On-Chip Superconducting Microwave Circulator from Synthetic Rotation", Physical Review Applied, vol. 4, 034002, Received Feb. 20, 2015; revised manuscript received Jun. 10, 2015; published Sep. 10, 2015; pp. 034002-1-034002-14.
Mahoney et al., "On-Chip Microwave Quantum Hall Circulator", http://arxiv.org/abs/1601.00634v1, Physical Review, vol. 7, 011007, Received Sep. 10, 2016; revised manuscript received Nov. 15, 2016; published Jan. 24, 2017; pp. 011007-1-011007-9.
Mckay et al., "A universal gate for fixed-frequency qubits via a tunable bus", http://arxiv.org/abs/1604.03076v2, Journal Phys. Rev. Applied 6, 064007 (2016) Dec. 19, 2016, pp. 1-10.

\* cited by examiner

CIRCULATOR FOR USE IN SUPERCONDUCTING QUANTUM TECHNOLOGY

FIELD OF THE INVENTION

The invention relates generally to a superconducting circulator device, and more specifically, to a modulatable superconducting resonator chained in a ring structure. The invention relates further to a method for operating a related superconducting circulator device.

BACKGROUND

Quantum computing is seen as the next big wave in computing technologies whereas classical computing, based on classical digital logic, is reaching its physical limitation. In order for universal quantum computing not only qubit (quantum bit) devices but also devices connecting the different qubits devices are required to allow a proper status detection. For this, ring resonators or circulators may be used. A circulator is a three (or more) port device with the unique characteristics that a specific port is unidirectional matched to its neighbor port on the left or right, but not to any other port (non-reciprocity). Today's common circulator technology is based on a magnetic field which typically is maintained by two permanent magnets.

The theory and implementation details can be reviewed in D. M. Pozar, +Microwave Engineering, (4th edition), John Wiley, 2005. The required macroscopic magnets prevent from integration of circulators into chip designs and from further down-scaling steps.

Related to superconducting quantum technologies, the magnets of traditional circulators have a significant negative influence on the neighboring circuitry and output signal measurements. Therefore, circulators usually need to be installed in a certain distance to the quantum circuits, which makes dense integration of these systems hard.

The paper of J. J. Lee et al., Magnetic Parameters for Ultra-high Frequency (UHF) Ferrite Circulator Design, Journal of Magnetics, Vol. 19, No. 4, pp 399-403, 2014, describes a design and fabrication of a ferrite based circulator and its measurements.

There are additional disclosures related to a superconducting circulator device. Document US 2015/0030280 A1 discloses a non-reciprocal device incorporating metamaterials which exhibit non-reciprocity through angular momentum biasing. The metamaterial, such as a ring resonator, is angular-momentum biased. This is achieved by applying a suitable mechanical or spatio-temporal modulation to resonant inclusions of the metamaterial, thereby producing strong non-reciprocity.

Document WO 2016/094045 A1 discloses a superconducting switch system that includes a filter network having an input portion and an output portion, and a variable inductance coupling element that couples the input portion to the output portion. The variable inductance coupling element has a first inductance that allows a desired portion of an input signal to pass from the input portion to the output portion as an output signal, and a second inductance state that suppresses the input signal from passing from the input portion to the output portion.

A disadvantage of known solutions is that often external magnetic fields are required or a solution is proposed comprising a varactor. However, this technology is not suitable for super conduction temperatures.

Hence, there may be a need to overcome the known disadvantages of today's common low temperature circulators and provide a circulator device not requiring external magnet fields or varactors.

SUMMARY

According to one aspect of the present invention, a superconducting circulator device may be provided. The superconducting circulator device may comprise more than two resonators of equal static resonance frequency chained to a ring system by strong coupling. Each of the resonators may comprise an adjustable inductor built into the each one of the resonators. The superconducting circulator device may also comprise a set of ports, each one of the ports coupled to a corresponding one of the more than two resonators, a set of modulators, each one of the modulators positioned adjacently to corresponding one of the adjustable inductor, and a set of modulation control ports, each of the modulation control ports connected to a corresponding modulator of the set of modulators such that each of the modulation control ports controls the related static resonance frequency of the related resonators and such that the ring system is modulatable.

According to another aspect of the present invention, a method for operating a superconducting circulator device may be provided. The superconducting circulator device may comprise more than two resonators of equal static resonance frequency chained to a ring system by strong coupling, wherein each of the resonators comprises an adjustable inductor built into each one of the more than two resonators. The method may comprise coupling a set of ports to the more than two resonators, wherein each one of the ports is coupled to one of the more than two resonators, controlling a static resonance frequency of the ring system using a set of modulators, each one of the modulators connected to a corresponding modulation port, and each one of the modulators being positioned adjacent to one of the adjustable inductors, and modulating the ring system by applying a modulation frequency to the set of modulation control ports.

BRIEF DESCRIPTION OF THE SEVERAL VIEWS OF THE DRAWINGS

It should be noted that embodiments of the invention are described with reference to different subject-matters. In particular, some embodiments are described with reference to method type claims, whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be disclosed within this document.

The aspects defined above, and further aspects of the present invention, are apparent from the examples of embodiments to be described hereinafter and are explained with reference to the examples of embodiments, but to which the invention is not limited.

Figure 1:
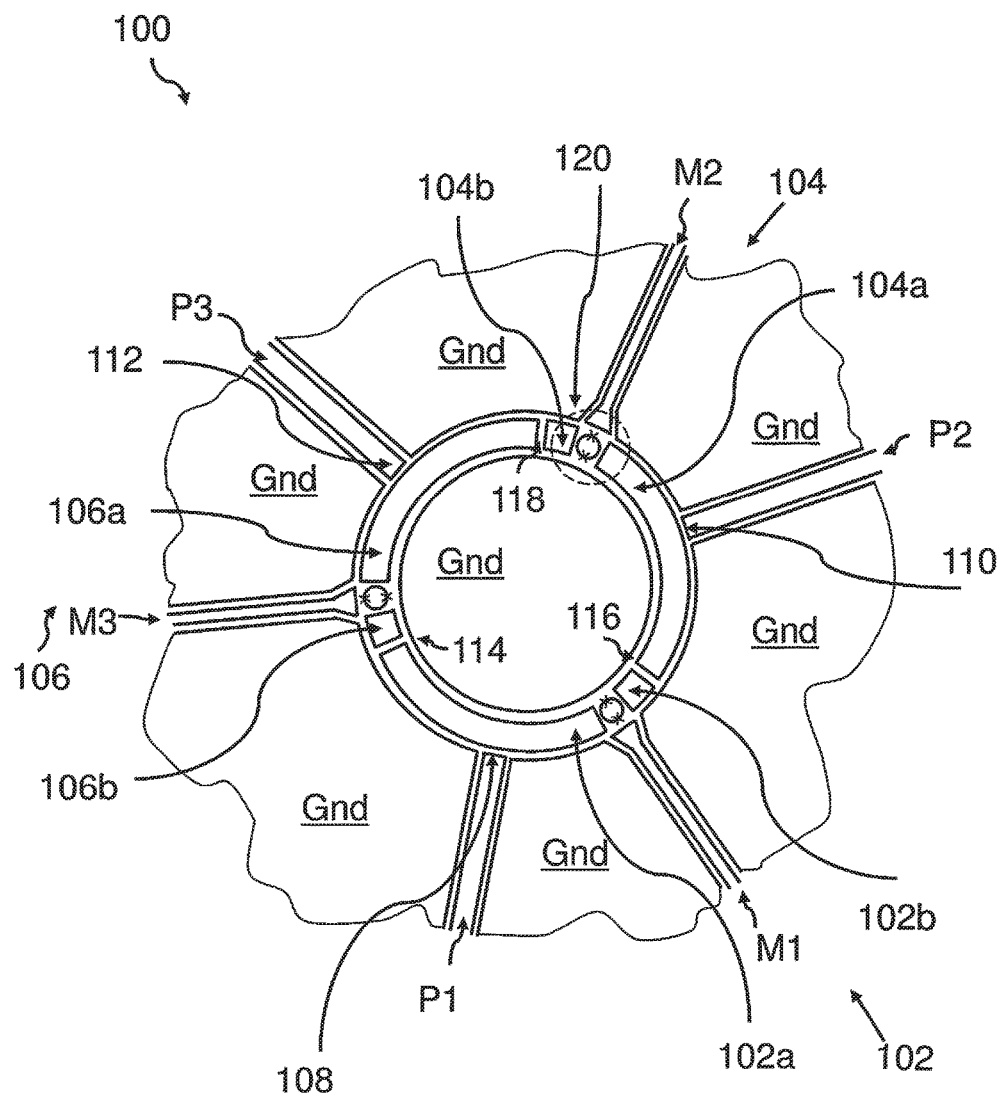

Preferred embodiments of the invention will be described, by way of example only, and with reference to the following drawings:

FIG. 1 shows a block diagram of an embodiment of the inventive superconducting circulator device.

Figure 2:
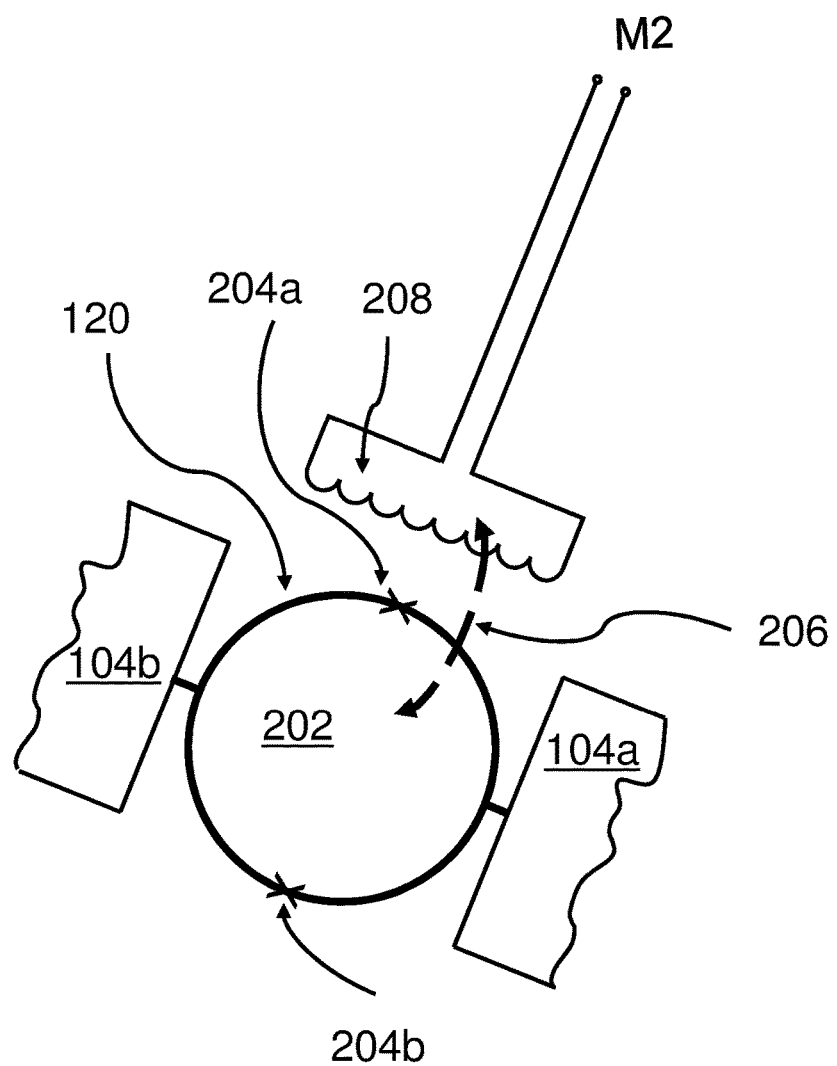

FIG. 2 shows a block diagram of a detailed view of an embodiment of one of the adjustable inductors with a related modulator.

Figure 3:
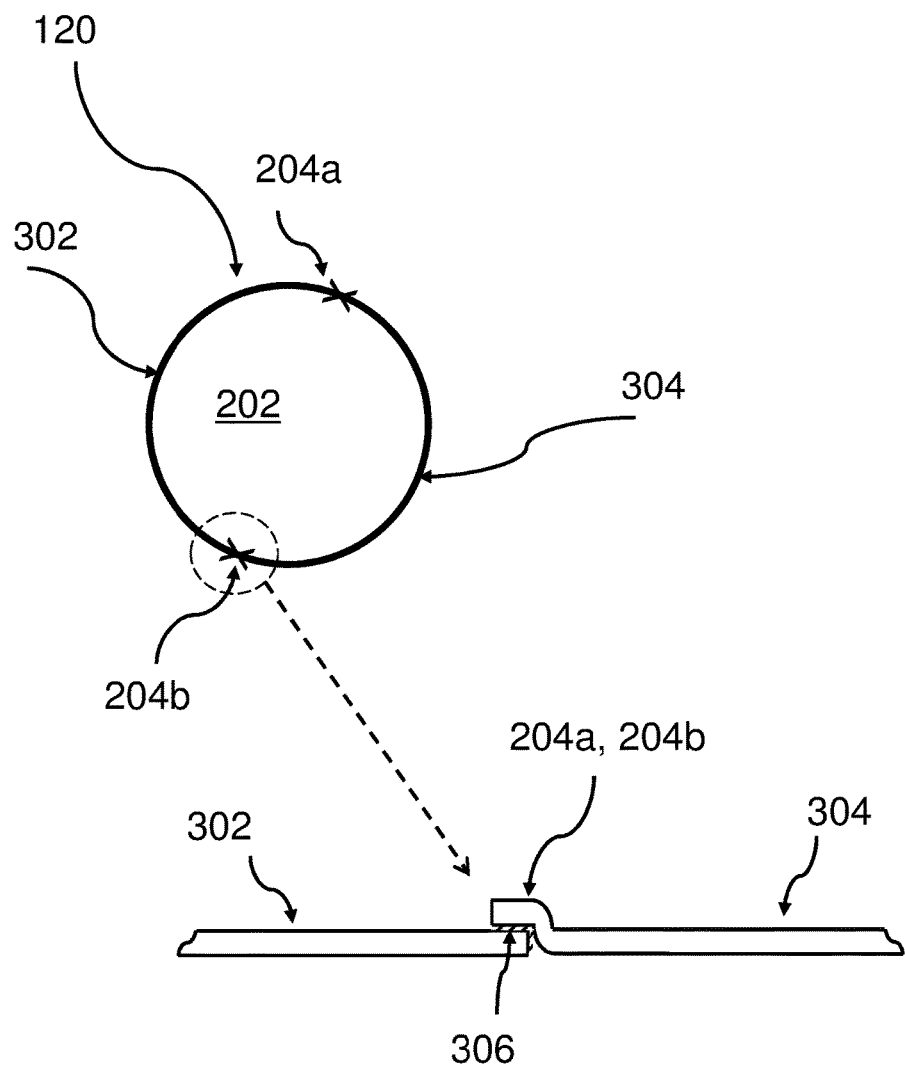

FIG. 3 shows a block diagram of a detailed view of an embodiment of one of the Josephson junctions of the adjustable inductor.

DETAILED DESCRIPTION

In the context of this description, the following conventions, terms and/or expressions may be used:

The term 'superconducting or superconductivity' may denote the phenomenon of exactly zero electrical resistance and expulsion of magnetic flux fields occurring in certain materials, called superconductors, when cooled below a characteristic critical temperature. It is characterized by the Meissner effect, the complete ejection of magnetic field lines from the interior of the superconductor as it transitions into the superconducting state. The occurrence of the Meissner effect indicates that superconductivity cannot be understood simply as the idealization of perfect conductivity in classical physics. The electrical resistance of a metallic conductor decreases gradually as temperature is lowered. In ordinary conductors, such as copper or silver, this decreasing effect may be limited by impurities and other defects. Even near absolute zero, a real sample of a normal conductor shows some resistance. In a superconductor, the resistance drops abruptly to zero when the material is cooled below its critical temperature. An electric current through a loop of superconducting wire can persist indefinitely with no power source.

The term 'circulator device'—or simply circulator—may denote a three (or more) port device with the unique characteristics that a specific port may be unidirectionally matched to its neighbor port on the left or right, but not to any other port (non-reciprocity). As already mentioned, the theory and implementation details may be reviewed in D. M. Pozar, +Microwave Engineering, (4th edition), John Wiley, 2005. The required macroscopic magnets prevent from integration of circulators into chip designs and from further down-scaling steps.

The term 'resonator' may denote a device, a portion of a device or system that exhibits resonance or resonant behavior, that is, it naturally oscillates at some frequencies, called its resonant frequencies, with greater amplitude than at others. The oscillations in a resonator can be either electromagnetic or mechanical (including acoustic). Resonators are used to either generate waves of specific frequencies or to select specific frequencies from a signal. In the context of this application only the electromagnetic version may be applicable. The here described resonators—in particular co-planar stripe resonators—are in a circle segment form so that a plurality of such resonators may form a ring or ring device.

It may be understood that the structure here denoted as resonator may also be seen as a partial resonator of wavelength W because the complete ring structure of the superconducting circulator device is "the real" resonator with a resonance frequency of N*W; N is the number of partial resonators.

The term 'ring system' may denote the entirety of the ring resonators—comprising ring segments—together with surrounding circuitry like modulation ports input and output ports, etc. However, the main components of the ring system may comprise the circle-segment-formed partial resonators together building the complete ring.

In classical systems the term 'strong coupling' may relate to a coupling constant or gauge coupling parameter with a number that determines the strength of the force exerted in an interaction. Such coupling constants may be used for all four fundamental forces including the electromagnetic interaction in a ring resonator. For a strong coupling in the sense of this superconducting application, where quantizations have to be considered, the limit $g>(\gamma+\kappa)$ is relevant, where g is the rate (in our case of microwave photons) at the port to the resonator to be consider, $\kappa$ is the rate of loss through all the other ports, and $\gamma$ is the de-coherence rate (e.g., loss into the substrate). Therefore, strong coupling is observable if g is larger than de-coherence rates $\gamma$ and $\kappa$.

The term 'adjustable inductor' may denote a device having a tunable inductance. A classical form may be a coil with a metal (or ferrite) core movable in and/or out the inner portion of the coil. In the here proposed concept, the tunability of the inductance may be achieved by a ring superconducting structure comprising two Josephson junctions influenceable by a small magnetic or electromagnetic field generated by a coil—potentially degenerated to a straight track—right beside the superconducting adjustable inductor.

The term 'Josephson junction' may denote a device making use of the Josephson Effect. This is the phenomenon of supercurrent—i.e., a current that flows indefinitely long without any voltage applied—across a device known as a Josephson junction (JJ), which consists of two superconductors coupled by a weak link. The weak link can consist of a thin insulating barrier (known as a superconductor—insulator—superconductor junction, or S-I-S), a short section of non-superconducting metal (S-N-S), or a physical constriction that weakens the superconductivity at the point of contact (S-s-S). The thin insulating barrier may be as thin as about 10 nm, but can be even just a few atomic layers thick. However, the main effect used for the variable resonators is the Josephson non-linear induction, which depends on the magnetic flux from the modulator. For small signals, a 100 nm×100 nm sized Josephson junction has a typical inductance of 100 nH which has a parabolic dependence on the applied flux.

The term 'port' may denote a structure designed to enable an electromagnetic coupling of an input signal to the superconducting circulator device.

The term 'modulator' may denote an electromagnetic device, e.g., a coil with as few as only one turn (more may be possible). This way, the coil may easily be manufactured as a printed device on a carrier board or printed circuit board, or directly by photo lithography on integrated silicon devices.

The term 'modulation control port' may denote electrical connections having contacts like terminal. The electrical connections may connect the modulator with the connection terminals for, e.g., electrically connecting a controller to the modulators.

In the following, a detailed description of the figures will be given. All instructions in the figures are schematic. Firstly, a block diagram of an embodiment of the inventive superconducting circulator device is given. Afterwards, further embodiments, as well as embodiments of the method for operating a superconducting circulator device, will be described.

FIG. 1 shows a block diagram of an embodiment of the inventive superconducting circulator 100 device. The superconducting circulator device 100 comprises more than two resonators 102, 104 and 106 (each resonator having an "a" and a "b" portion, i.e., e.g., 102a, 102b) of equal static resonance frequency, chained to a ring system by strong coupling, wherein each of the resonators 102, 104 and 106 comprises an adjustable inductor 120 (only with a reference sign in resonator 104) built into the each one of the resonators 102, 104 and 106.

The inventive superconducting circulator 100 comprises also a set of ports P1, P2, P3. Each one of the ports P1, P2, P3 is coupled to a corresponding one of the more than two resonators 102, 104 and 106. The coupling is done at areas 108, 110 and 112, e.g., in the middle of a related resonator. Here the coupling from the port to the resonator may be optimized. However, other coupling position between the port and the resonator are possible.

Furthermore, the inventive superconducting circulator 100 comprises also a set of modulators (shown in detail in FIG. 2). Each one of the modulators is positioned adjacently to a corresponding one of the adjustable inductors 120.

It may be noted that the ports selected not to be output ports may be terminated, e.g., by a 50Ω resistor.

Additionally, the superconducting circulator device 100 comprises a set of modulation control ports M1, M2 and M3. Each of the modulation control ports is connected to a corresponding modulator of the set of modulators such that each of the modulation control ports M1, M2 and M3 controls the related static resonance frequency of the related resonators and such that the ring system is modulatable.

In-between the ports P1 . . . P3 and M1 . . . M3 ground areas (Gnd) are visible for a proper electro-magnetic shielding. It may also be mentioned that the coupling between the resonators happens at the areas 114, 116 and 118.

It may be noted that the modulation frequency may be in the range of about 300 MHz. But a wide variety of frequency band may be used for the modulation. A typical operating frequency of the superconducting circular device 100 may be in the range of typically 1%-10% of the resonance frequency of the static resonance frequency. For very high static resonance frequencies, lower modulation frequencies may be possible; whereas for very low static resonance frequencies, higher modulation frequencies may be required.

FIG. 2 shows a block diagram of a detailed view of an embodiment of one of the adjustable inductors 120 with a related modulator 208. The modulator has the form of a coil—eventually with only one turn. The adjustable inductor includes a superconducting ring 202 with two Josephson junctions 204a and 204b (just one, or more are possible). The magnetic flux of the modulator through the ring 202 (indicated by the dashed double-arrow line 206) influences the inductivity of the Josephson junctions 204a and 204b. As can be seen, the ring 202 is connected with each of its two portions to the resonator 104 (with portions 104a, 104b). This way, there is only a marginal destructive influence on the quality in the respective resonator 104.

More than one adjustable inductor may be connected in series and position within the respective resonator in parallel with a tangent or the ring-segment-like resonator.

As an example, the stripe resonator may have, e.g., a length of about 6 mm and a width of about 6 micrometer. The diameter of one of the adjustable inductors may be in the range of up to 5 times the width of the resonator. As a rule of thumb one may say that the length of the adjustable inductor should not be longer than 1/20 of the length of the resonator.

It may also be noted that the shape of the ring-segment shaped resonators may be degenerated to a dot-like, pie-chart-like structure. In such a case, the ring structure of the superconducting circular device does no longer exist but the general relevant characteristics remain. Hence, also a y-shape form of the superconducting circular device is possible without deviate from the general inventive concept.

FIG. 3 shows a block diagram of a detailed view of an embodiment of one of the Josephson junctions 204a, 204b of the adjustable inductor 120. Here, also the two portions 302, 304 of the ring 202 have reference signs. The detailed view of a single Josephson junction is shown in the bottom of the figure as overlapping portions 302, 304 of the ring 202. It may be noted that the barrier, e.g., oxide 306, may be in the range of 10 nm, but even as low as just a few atomic layers.

It may also be mentioned that the temperature of the superconducting circulator device may be operated below the transition temperature of the used superconductor, and more specifically below 0.2K, in particular below 0.02K. Quantum electro-dynamics (QED) relies on the thermal limit $T<\hbar\omega_r/k_B$, where T is the temperature limit, $\hbar$ is Planck's constant, and $k_B$ is the Boltzmann constant. This leads to an operating temperature. For example, a microwave photon at 6 GHz has a temperature equivalent of about 290 mK. To observe single 6 GHz photons, an environmental temperature well below 290 mK is required to separate signals from noise.

The superconducting circulator device may offer multiple advantages and technical effects:

The superconducting circulator device with its resonators is parametrically tunable by incorporated variable inductors, based on superconducting Josephson junction technology. The variable inductors may allow to be controlled by a field of a DC bias current through the modulators to adjust the resonators resonance frequency. Additionally, a low frequency AC current may allow to parametrically modulating the superconducting circulator device consisting of all the resonators. The AC modulation of the resonators is relatively phase shifted to its neighbors, which equally distributes them over the 360°. This may impart an angular momentum in the ring structure which may create the necessary non-reciprocity to transfer signals from one resonator to one of its neighbors but not to the other neighbor. This is the function of a circulator which may be modified to behave as isolator—in the three port case—by terminating one of the ports. The structures and concepts herein are applicable to design devices with three and more ports.

The superconducting circulator device can be configured to have clock or counter clock-wise non-reciprocity.

The superconducting circulator device is no longer based on a magnetic field (if compared to state-of-the-art devices) supplied from outside, but on an angular momentum biasing gained from a circular inductive modulation scheme. This may cause an effective electronic spin which may lift the degeneracy of counter propagating states and therefore induces non-reciprocity.

Moreover, the inductive modulation scheme may be lossless and therefore ideal for the application in superconducting quantum technologies. The superconducting circulator device may be adaptable to any number of ports equal to three or higher. Like other circulator technologies, the device is configurable to function as an isolator in one circular direction, and thus, as a switch. The working frequency at user ports as well as the modulation frequency may be adjusted over a broad range.

According to a further embodiment, each one of the adjustable inductors of the superconducting circulator device may comprise at least one Josephson junctions. Thus, this structure may basically be built like a SQUID (superconducting quantum interference device), i.e., a superconducting ring structure with at least two Josephson junctions at, e.g., opposite sides of the ring. However, more than two Josephson junctions may be integrated into the adjustable inductors.

The superconducting circulator device may be spatio temporarily modulatable in a circular fashion with a static frequency equally-phase-shifted over the chained resonators. The phase shift may, typically be 120° for three resonators and e.g., 90° for four resonators. One of the ports may be used as input port and the other ports may operate as output ports. Depending on the direction of the phase shift different directions of signal distributions may be achieved.

Further, the superconducting circulator device may be operable as a left-directing or right-directing circulator depending on a direction of a phase shift—in particular + or −120° for three resonators and + or −90° for four resonators—of the static frequency equally-phase-shifted over the chained resonators. This behavior may be applied to use the circulator as a 1-to-2 or a 2-to-1 switch depending on corresponding terminators—e.g., 50 Ohm—connected to the ports.

According to a permissive embodiment of the superconducting circulator device, each one of the adjustable inductors may be positioned adjacently to an end—or in the center—of a respective resonator. This way, a wave traveling over the resonator may be disturbed as little as possible while at the same time the influence on the resonance frequency of the resonator by the adjustable inductor is significant. However, also other positions of the adjustable inductor in the shape of the resonators are possible. A good effect of the adjustable inductors may be achieved if the adjustable inductors is positioned within the stripe shape of the resonator at a position where a minimum of the magnetic wave is positioned—i.e., the magnetic node (and thus the maximum of the electrical field)—in operation of the ring resonator. Besides ends of a resonator, also a central position near the coupling point of the port of the resonator may be a useful position.

According to one optional embodiment, each one of the adjustable inductors may be marginal if compared to the size of the resonator so that an electromagnetic wave on the resonator is disturbed only marginally. This may allow for a good correlation factor. As an example, the dimension of the adjustable inductor may in the micrometer or even nanometer range, wherein the length of a resonator may be in the millimeter range.

Further, a static resonance frequency of each resonator of the superconducting circulator device may be adjustable by an application of a constant current to the modulation control ports. Hence, the ring resonators may become easily tunable around a middle resonance frequency such that, e.g., non-uniformities from a fabrication process may be compensated.

In the superconducting circulator device, each one of the more than two resonators comprises at least one material selected out of the group comprising Nb, Al, Ni-nitride, and Nb-titanide. However, also other suitable superconducting materials, as well as high-temperature superconductors, may be applicable.

Further, each one of the adjustable inductors of the superconducting circulator device may be a set—in particular at least two—of adjacent adjustable inductors incorporated in a row into one of the ring resonators, i.e., incorporated adjacently to an end of a longitudinal ring-segment shape of one of the ring resonators. Thus, a stronger influence of the adjustable inductors on the resonance frequency may be achieved. In this case, the plurality of adjustable inductors may be excited together by a corresponding modulator port. Alternatively, each of the adjustable inductors may have its own modulator port and a potential delay line between them.

In a further embodiment of the method, an input signal applied to one of the ports may result in an output signal at the port of the resonator on a left or a right side of the resonator relating to the one of the ports, the input signal was supplied. Thus, the output signal does not appear at the next port, but the following one. As a result, a switch structure may be achieved in which the port of the output signal may depend on a right or left circular shift of the incoming signals. Hence, the circular device may also be applied to multiplex or de-multiplex signals.

Further, the method may also comprise modulating a set of adjacently positioned, adjustable inductors by one out of the set of modulator ports simultaneously, wherein each one of the set of adjustable inductors, in particular, at least two—may be positioned in a row along a shape of one of the ring resonators. In sum, more than one adjustable inductor may have a higher influence than just one adjustable inductor.

The descriptions of the various embodiments of the present invention have been presented for purposes of illustration, but are not intended to be exhaustive or limited to the embodiments disclosed. Many modifications and variations will be apparent to those of ordinary skills in the art without departing from the scope and spirit of the described embodiments. The terminology used herein was chosen to best explain the principles of the embodiments, the practical application or technical improvement over technologies found in the marketplace, or to enable others of ordinary skills in the art to understand the embodiments disclosed herein.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

The flowcharts and/or block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or act or carry out combinations of special purpose hardware and computer instructions.

The terminology used herein is for the purpose of describing particular embodiments only and is not intended to limit the invention. As used herein, the singular forms "a", "an"

and "the" are intended to include the plural forms as well, unless the context clearly indicates otherwise. It will further be understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or steps plus function elements in the claims below are intended to include any structure, material, or act for performing the function in combination with other claimed elements, as specifically claimed. The description of the present invention has been presented for purposes of illustration and description, but is not intended to be exhaustive or limited to the invention in the form disclosed. Many modifications and variations will be apparent to those of ordinary skills in the art without departing from the scope and spirit of the invention. The embodiments are chosen and described in order to best explain the principles of the invention and the practical application, and to enable others of ordinary skills in the art to understand the invention for various embodiments with various modifications, as are suited to the particular use contemplated.

What is claimed is:

1. A superconducting circulator device comprising
two or more resonators of equal static resonance frequency chained to a ring system by strong coupling, wherein each of said resonators comprises an adjustable inductor built into each one of said resonators,
a set of ports, each one of said ports coupled to a corresponding one of said two or more resonators, and
a set of modulators, each one of said modulators positioned adjacent to corresponding one of said adjustable inductor,
a set of modulation control ports, each of said modulation control ports connected to a corresponding modulator of said set of modulators such that each of said modulation control ports controls said related static resonance frequency of said related resonators and such that said ring system is modulatable.

2. The superconducting circulator device according to claim 1, wherein each one of said adjustable inductors comprises at least one Josephson junction.

3. The superconducting circulator device according to claim 1, wherein said superconducting circulator device is spatio temporarily modulatable in a circular fashion with a static frequency equally-phase-shifted over said chained resonators.

4. The superconducting circulator device according to claim 1, wherein said superconducting circulator device is operable as a left-directing or right-directing switch depending on a direction of a phase shift of said static frequency equally-phase-shifted over said chained resonators.

5. The superconducting circulator device according to claim 1, wherein each one of said adjustable inductors is positioned adjacently to an end of a respective resonator.

6. The superconducting circulator device according to claim 1, wherein each one of said adjustable inductors is marginal if compared to said size of said resonator so that an electromagnetic wave on said resonator is disturbed only marginally.

7. The superconducting circulator device according to claim 1, wherein a static resonance frequency of each resonator is adjustable by an application of a constant current to said modulation control ports.

8. The superconducting circulator device according to claim 1, wherein each one of said more than two resonators comprises at least one selected out of the group comprising Nb, Al, Ni-nitride, and Nb-titanide.

9. The superconducting circulator device according to claim 1, wherein each one of said adjustable inductors is a set of adjacent adjustable inductors incorporated in a row into one of said ring resonators.

10. A method for operating a superconducting circulator device having more than two resonators of equal static resonance frequency chained to a ring system by strong coupling, wherein each of said resonators comprises an adjustable inductor built into each one of said more than two resonators, the method comprising:
coupling a set of ports to said more than two resonators, wherein each one of said ports is coupled to one of said more than two resonators, and
controlling a static resonance frequency of said ring system using a set of modulators, each one of said modulators connected to a corresponding modulation port, and each one of said modulators being positioned adjacently to one of said adjustable inductors, and
modulating said ring system by applying a modulation frequency to said set of modulation control ports.

11. The method according to claim 10, wherein each one of said adjustable inductors comprises at least one Josephson junctions.

12. The method according to claim 10, further comprising:
modulating said superconducting circulator device spatio temporarily in a circular fashion with a static frequency equally-phase-shifted over said chained resonators.

13. The method according to claim 10, wherein each of said adjustable inductors is positioned adjacently to an end of a respective resonator.

14. The method according to claim 10, wherein each one of said adjustable inductors is marginal if compared to said size of said resonator so that an electromagnetic wave on said resonator is disturbed only marginally.

15. The method according to claim 10, also comprising:
adjusting said static resonance frequency of each of the resonators by applying a constant current to a corresponding one of said modulation control ports.

16. The method according to claim 10, wherein each of said set of said
adjustable inductors is in its lateral dimensions as wide as a corresponding resonator.

17. The method according to claim 10, wherein an input signal applied to one of said ports results in an output signal at said port of said resonator on left side or a right side of said resonator relating to said one of said ports, said input signal was supplied.

18. The method according to claim 10, further comprising:
modulating a set of adjacently positioned, adjustable inductors by one out of said set of modulator ports simultaneously, wherein each one of said set of adjustable inductors is positioned in a row along a shape of one of said ring of resonators.

* * * * *